US011314228B2

(12) United States Patent
Dostert et al.

(10) Patent No.: US 11,314,228 B2
(45) Date of Patent: Apr. 26, 2022

(54) SYSTEM AND METHOD FOR VALIDATING AND INSPECTING COMPOSITE PARTS

(71) Applicant: THE BOEING COMPANY, Chicago, IL (US)

(72) Inventors: Stephen Dostert, Daniel Island, SC (US); Jeffrey L. Miller, Mukilteo, WA (US); Michael Honea, North Charleston, SC (US)

(73) Assignee: The Boeing Company, Chicago, IL (US)

( * ) Notice: Subject to any disclaimer, the term of this patent is extended or adjusted under 35 U.S.C. 154(b) by 897 days.

(21) Appl. No.: 15/006,230

(22) Filed: Jan. 26, 2016

(65) Prior Publication Data
US 2017/0212500 A1 Jul. 27, 2017

(51) Int. Cl.
G05B 19/4097 (2006.01)
G06F 30/00 (2020.01)
G05B 19/4065 (2006.01)

(52) U.S. Cl.
CPC ..... G05B 19/4097 (2013.01); G05B 19/4065 (2013.01); G06F 30/00 (2020.01); G05B 2219/35012 (2013.01); G05B 2219/50206 (2013.01)

(58) Field of Classification Search
None
See application file for complete search history.

(56) References Cited

U.S. PATENT DOCUMENTS

| 4,918,627 | A | 4/1990 | Garcia |
| 6,804,568 | B1 | 10/2004 | Miyazaki |
| 2002/0015036 | A1 | 2/2002 | Shiroyama |
| 2013/0141300 | A1* | 6/2013 | Runyon .................... H01P 5/12 343/786 |
| 2015/0043011 | A1 | 2/2015 | Kaufman |

FOREIGN PATENT DOCUMENTS

WO   WO 2006/07684   7/2006

OTHER PUBLICATIONS

Extended European Search Report for EP 16200364.4-1954/ 3200104, dated Jul. 5, 2017.

* cited by examiner

Primary Examiner — Mohammad Ali
Assistant Examiner — Saad M Kabir
(74) Attorney, Agent, or Firm — The Small Patent Law Group LLC; Joseph M. Butscher

(57) ABSTRACT

A part analysis tool is used to analyze aspects of a composite part. The part analysis tool includes a verification control unit that compares numerical control data used to control operation of a forming system that is used to form the composite part to computer-aided design (CAD) data that includes an authoritative part definition for the composite part. The verification control unit determines whether the numerical control data is within one or more conformance thresholds related to the CAD data. The part analysis tool may also include an inspection control unit that compares inspection data of one or more plies of the composite part to the CAD data. The inspection control unit determines whether the inspection data is within the conformance threshold(s) related to the CAD data.

20 Claims, 2 Drawing Sheets

SYSTEM AND METHOD FOR VALIDATING AND INSPECTING COMPOSITE PARTS

FIELD OF THE DISCLOSURE

Embodiments of the present disclosure generally relate to systems and methods for validating and inspecting composite parts.

BACKGROUND OF THE DISCLOSURE

Various structures are formed from composite materials. The composite materials may be or include a polymer matrix reinforced with fibers. The fibers may be bound together with polymers, such as epoxy. Known fibers include glass, carbon, basalt, aramid, or the like.

Numerous structural components are used to form a typical aircraft. For example, wing and empennage surfaces of an aircraft typically include stringers that are coupled to skin members on the wing and empennage surfaces that cooperatively provide a desired flexural and torsional stiffness to the wing and empennage surfaces.

Aircraft structures may be formed from composite materials, particularly in applications in which relatively low weight and high mechanical strength are desired. Accordingly, composite materials are widely used in a variety of commercial and military aircraft, as well as terrestrial vehicles and consumer products. A composite material may include a network of reinforcing fibers that are generally applied in layers, and a polymeric resin that substantially wets the reinforcing fibers to form a binding contact between the resin and the reinforcing fibers. The composite material may then be formed into a structural component by a variety of known forming methods, such as an extrusion process or other forming processes.

In order to form (such as by fabricating) a composite part for an aircraft, for example, a computer-aided design (CAD) system is typically used to first define various parameters of the composite part. The CAD system provides an engineering definition for the composite part. After the engineering definition for the composite part is generated, numerical control data (for example, machine control data) programs are input into forming equipment (such as composite layup equipment) that is used to form (for example, fabricate) the composite part based on the engineering definition. Typically, the numerical control programs are created using independent software.

Part manufacturers often provide various rules that define composite part layup. For example, the rules may include definitions for boundaries, internal stagger, minimum course lengths, orientations, angularity requirements, and the like. In order to control the quality of a composite part, the numerical control programs are typically validated prior to building the composite part.

Known methods of validating numerical control programs often involve manual interrogation or verification of the composite part during or after a layup process. As can be appreciated, physically inspecting a part during or after a forming process is tedious and time-consuming.

Moreover, checking ply stagger of a composite part may be difficult, if not impossible, on a shop floor, as each successive composite layer covers an underlying layer. Additionally, validating part angularity may prove difficult, as plies of composite material may be long, and various portions of the plies may not be readily accessible. In general, known methods of validating and inspecting composite parts are time-consuming and often inefficient.

SUMMARY OF THE DISCLOSURE

A need exists for an efficient method of verifying a numerical control program with an engineering definition of a composite part. A need exists for an efficient method of inspecting a composite part-forming operation.

With those needs in mind, certain embodiments of the present disclosure provide a part analysis tool for analyzing aspects of a composite part. The part analysis tool may include a verification control unit that compares numerical control data (used to control operation of a forming system that is used to form the composite part) to computer-aided design (CAD) data that includes an authoritative part definition for the composite part. The verification control unit determines whether the numerical control data is within one or more conformance thresholds related to the CAD data.

The verification control unit may disregard non-essential data within the numerical control data. The non-essential data may be data that is unrelated to laying up plies of composite material that form the composite part. The numerical control data may include structural and geometric data of the composite part. The structural and geometric data of the composite part may include part length, number of plies of composite material, ply boundary areas, stagger between plies, ply orientation, and angular deviation between plies.

The part analysis tool may also include an inspection control unit that compares inspection data of one or more plies of the composite part to the CAD data. The inspection control unit determines whether the inspection data is within the conformance threshold(s) related to the CAD data.

In at least one embodiment, the inspection control unit compares the inspection data to the CAD data after the verification control unit compares the numerical control data to the CAD data. In at least one other embodiment, the inspection control unit compares the inspection data to the CAD data as the verification control unit compares the numerical control data to the CAD data. The inspection control unit may analyze the inspection data of a virtual representation of the composite part.

Certain embodiments of the present disclosure provide a composite part forming system configured to form a composite part. The composite part forming system may include a computer-aided design (CAD) system operable to generate CAD data that includes an authoritative part definition for the composite part, a forming system operable to form the composite part based on numerical control data, an inspection system operable to inspect the composite part before, during, or after formation of the composite part and generate inspection data that relates to inspection of the composite part, and a part analysis tool. The part analysis tool may include a verification control unit that compares the numerical control data used to control operation of the forming system to the CAD data. The verification control unit determines whether the numerical control data is within one or more conformance thresholds related to the CAD data. The part analysis tool may also include an inspection control unit that compares the inspection data to the CAD data. The inspection control unit determines whether the inspection data is within the conformance threshold(s) related to the CAD data.

Certain embodiments of the present disclosure provide a method for analyzing aspects of a composite part. The method may include generating computer-aided design (CAD) data that includes an authoritative part definition for the composite part, receiving numerical control data used to control operation of a forming system that is used to form the composite part, comparing the numerical control data to the CAD data, determining (through comparing the numerical control data to the CAD data) whether the numerical control data is within one or more conformance thresholds related to the CAD data, receiving inspection data of one or more plies of the composite part, comparing the inspection data to the CAD data, and determining (through comparing the inspection data to the CAD data) whether the inspection data is within the conformance threshold(s) related to the CAD data.

DETAILED DESCRIPTION OF THE DISCLOSURE

Figure 1:
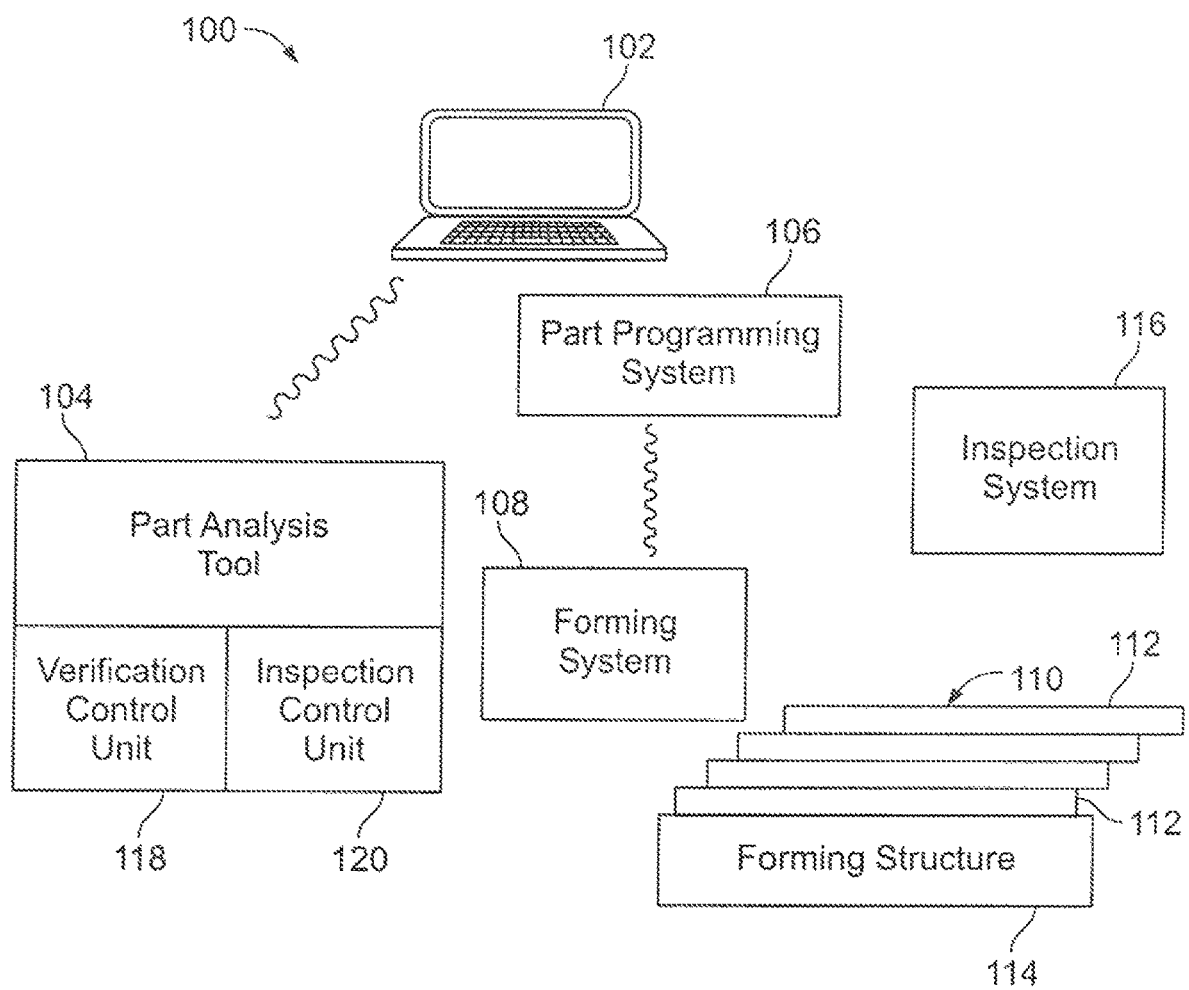
FIG. 1 illustrates a schematic diagram of a composite part forming system, according to an embodiment of the present disclosure.

The foregoing summary, as well as the following detailed description of certain embodiments will be better understood when read in conjunction with the appended drawings. As used herein, an element or step recited in the singular and preceded by the word "a" or "an" should be understood as not necessarily excluding the plural of the elements or steps. Further, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular condition may include additional elements not having that condition.

Certain embodiments of the present disclosure provide a system and method of automatically, accurately, and efficiently comparing part programs that drive forming (for example, fabrication) systems (such as composite layup machines) and inspection media to an engineering source. The systems and methods eliminate, minimize, or otherwise reduce manual effort in relation to validating numerical control programs that are used for part fabrication and verification. Certain embodiments of the present disclosure provide an automated tool that reliably and rapidly compares a forming system (such as a lamination machine) program, and/or inspection media, to an engineering source (such as generated by a CAD system) to ensure that engineering and process specific rules are in compliance. Embodiments of the present disclosure provide systems and methods that reduce the risk of discovering part non-compliance on a shop floor, and which operate rapidly and efficiently.

Certain embodiments of the present disclosure provide systems and methods that may be configured to compare laser projection files and part program geometry directly to an engineering source (such as generated by a CAD system). Further, embodiments of the present disclosure may be configured to verify that areas of a composite part that are to be inspected in real-time (through non-contact methods such as gap and overlap analysis, foreign object debris detection, fuzz ball detection, resin blob detection, and the like) are addressed and inspected. Also, embodiments of the present disclosure may be configured to import gap and overlap information detected by part programming tools for direct comparison to the engineering source.

Certain embodiments of the present disclosure provide systems and methods that may convert numerical control data (which may be or otherwise generated by numerical control data programs for driving a tape or fiber placement machine) into a geometry that may be interpreted by a CAD system, for example. The systems and methods may strip non-essential data from the part programs such that geometric information is retained. The non-essential data may be data that is not related to lay-up operations used to form the composite material. For example, the non-essential data may relate to heating temperature, curing times, and the like. Data that is not related to instructions for actual laying up composite material may be ignored as non-essential data. Data that relates to instructions for laying up composite material may include structural and geometric data of the composite part, such as ply thickness, angularity, stagger between plies, and the like.

The systems and methods may track course centerline data and determine where tows (for example, strips, courses, tape, and the like) begin and end. If composite material is not being dispensed, the systems and methods may disregard operations as non-essential.

Engineering data for a composite part is available (for example, generated) in a CAD system. The engineering data may include surface information for each ply, fiber direction, and boundaries. The systems and methods may compare the geometry of the composite part extracted from the machine control data files to the engineering definition within the CAD system to ensure that the composite part is formed (for example, fabricated) in compliance with engineering and process specifications. Further, inspection data such as ply boundary information may be imported and compared to part programs and the engineering source. The systems and methods may utilize a defined rule set to suggest start point adjustments to satisfy stagger requirements through a laminate, thereby avoiding time-consuming iterative manual processes.

Certain embodiments of the present disclosure provide a method for validating placement of composite materials that may include receiving numerical control data, disregarding non-essential data from the numerical control data to form modified numerical control data (in which the non-essential data includes data from movements in which composite materials are not being placed), importing or otherwise reading the modified numerical control data into a CAD system, and comparing a CAD model and the modified numeral control data to determine if the modified numerical control data conforms to engineering specifications. The systems and methods may accept numerical control data (such as machine control data) when composite material is being placed (for example, laid up) or otherwise actively being maneuvered for formation of the composite part. If the modified numerical control data deviates from the CAD data beyond a predetermined threshold, an alert may be sent.

Embodiments of the present disclosure provide systems and methods that are configured to automatically and efficiently analyze information for defining, building, and inspecting a composite part to ensure engineering and process-specific requirements are satisfied. Further, the systems and methods may be used to virtually verify design requirements of a composite part before actual fabrication of the composite part.

FIG. 1 illustrates a schematic diagram of a composite part forming system 100, according to an embodiment of the present disclosure. The system 100 may include a computer-aided design (CAD) system 102 in communication with a part analysis tool 104. The CAD system 102 may be a computerized workstation (such as a laptop or desktop computer, a smart tablet or device, and/or the like) that runs CAD software that is used to generate CAD data for a composite part. The CAD data provides an authoritative part definition for a composite part. The authoritative part definition may include part length, number of plies of composite material, ply boundary areas, stagger between plies, ply orientation, angular deviation between plies, and the like. The CAD system 102 may be communicatively coupled to the part analysis tool 104 through one or more wired and/or wireless connections. In at least one embodiment, the CAD system 102 and the part analysis tool 104 may be housed within the same computer workstation. In at least one other embodiment, the CAD system 102 and the part analysis tool 104 may be housed in separate and distinct computer workstations.

A part programming system 106 is communicatively coupled to a forming system 108, which may include one or more of a cutting device, a laminator, a ply orientation device, and/or various other machines used to lay up composite plies and form a composite part. For example, the forming system 108 is used to lay up plies 112 of composite material on a forming structure 114 (such as a platform, table, mandrel, and/or the like). The part programming system 106 may be contained within a separate and distinct computer workstation, or may be contained within the same computer workstation as the CAD system 102 and/or the part analysis tool 104. The part programming system 106 may operate the forming system 108 based on a computer aided manufacturing (CAM) program. The CAM program operates the forming system 108 (such as by driving a composite tape laying machine) to form the composite material 110.

An inspection system 116 is used to inspect the plies 112 as or after the composite part 110 is formed. The inspection system 116 may be communicatively coupled to the CAD system 102 and/or the part analysis tool 104. The inspection system 116 may be or include a laser projector, laser tracing device, infrared device, and/or the like that is used to detect various aspects (such as location, length, angular position, thickness, and the like) of the plies 112 and/or the composite part 110.

The part analysis tool 104 may include a verification control unit 118 and an inspection control unit 120. The verification control unit 118 and the inspection control unit 120 may be separate and distinct control units within the part analysis tool 104. Optionally, the verification control unit 118 and the inspection control unit 120 may be integrated into a single control unit.

In operation, the CAD system 102 is used to generate CAD data for the composite part 110. The CAD data may include an authoritative part definition for the composite part 110 and process specifications for forming the composite part 110. In short, the CAD system 102 is used to generate engineering requirements for the composite part 110, such as size, shape, thickness, resin location, and/or the like.

Figure 2:
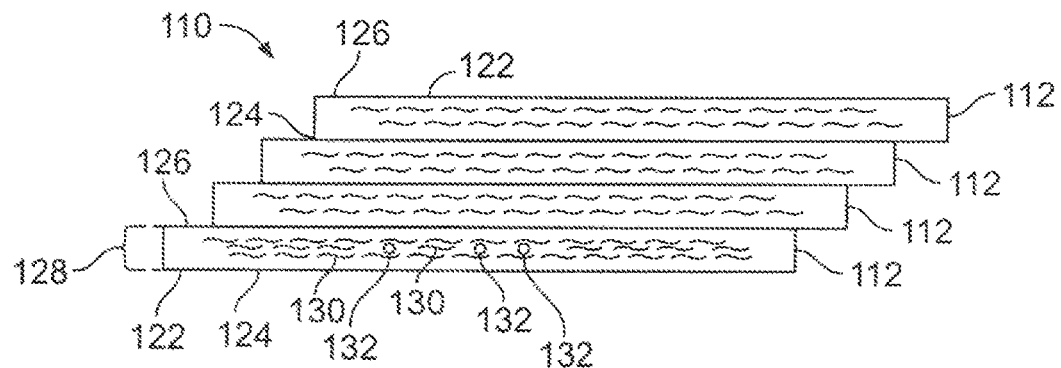
FIG. 2 is a simplified diagrammatic representation of an edge view of a composite part, according to an embodiment of the present disclosure.

FIG. 2 is a simplified diagrammatic representation of an edge view of the composite part 110, according to an embodiment of the present disclosure. As noted above, the composite part 110 may be formed from a plurality of composite layers or plies 112. The composite part 110 may be formed of more or less plies 112 than shown. The plies 112 are laid up to form the composite part 110. As shown, the plies 112 may be staggered with respect to one another such that ends of adjacent plies are not vertically aligned with respect to one another.

The plies 112 may be flexible, resilient sheets, panels or layers of composite material. In at least one embodiment, one or more of the plies may be a pre-impregnated ("pre-preg") composite fiber layer. The plies 112 may include a matrix material, such as epoxy, resin, and/or the like. The plies 112 may include a plurality of fibers that may be aligned and/or woven together, for example. The epoxy and/or resin may be used to bond the woven fibers together.

A ply 112 may include a main body 122 having opposed first and second surfaces, such as bottom and top planar surfaces 124 and 126, respectively, separated by a thickness 128. The thickness 128 may be, for example, 250 microns. Alternatively, the thickness 128 may be greater or lesser than 250 microns. The main body 122 may be formed of composite fibers 130 (such as carbon fibers, fiberglass, or the like) aligned and/or woven together. The composite fibers 130 may be bonded together through epoxy 132, for example. For the sake of clarity, only a portion of the composite fibers 130 and epoxy 132 are shown.

Referring again to FIG. 1, after the CAD data is generated by the CAD system 102, the part programming system 106 is used to generate (such as through user input) CAM data that is used to operate the forming system 108. Numerical control data is then input into the part programming system 106 and/or the forming system 108 so that the forming system 108 may form the composite material 110 in accordance with the CAD data.

Before the forming system 108 operates to form the composite part 110, the part analysis tool 104 validates the numerical control data with the CAD data. For example, the verification control unit 118 compares the numerical control data with the CAD data to determine whether the numerical control data conforms to the CAD data. For example, the part analysis tool 104 may store one or more conformance thresholds in memory, which may be part of the verification control unit 118 or otherwise communicatively coupled thereto. The conformance thresholds may provide a range of variance from particular features defined in the CAD data. For example, a conformance threshold for stagger distance may be plus or minus 0.1 inch, or an increment thereof. Optionally, the conformance threshold may be greater or less than plus or minus 0.1 inch. As another example, a conformance threshold for angularity may be plus or minus 1 degree. Optionally, the conformance threshold may be greater or less than plus or minus 1 degree.

If the numerical control data does conform to the CAD data, the forming system 108 may begin to lay up the plies 112 to form (for example, fabricate) the composite part 110. If the numerical control data does not conform to the CAD data, the part analysis tool 104 may generate an alert. When the alert is generated, the forming system 108 may refrain from forming the composite part 110. In response to the verification control unit 118 determining that the numerical control data does not conform to the CAD data, the part analysis tool may alert the part programming system 106 that the CAM and/or the numerical control data is to be revised. In at least one embodiment, the verification control unit 118 may provide suggestions that remedy the non-conformity between the numerical control data and the CAD data. For example, the verification control unit 118 may provide ply stagger point suggestions to the part programming system 106.

The verification control unit 118 may check various structural and geometric properties of the numerical control data in relation to the CAD data. For example, the verification control unit 118 may check ply boundaries (for example, boundary areas between plies 112), course length (for example, a length of each ply), stagger between plies (the plies may be staggered so that ends of the plies are not vertically aligned, in order to reduce areas of weakness), ply orientation (for example, how each ply is positioned in relation to another ply), angular deviation between plies 112, and the like. The structural and geometric properties may relate to features of the plies 112 as they are to be laid up over the forming structure 114 and/or another ply 112. Other data that relates to aspects of the forming (for example, fabrication) process that are not related to ply lay-up operations (for example, temperature of a forming environment, curing time, type of forming structure used, and the like) are considered non-essential and may be discarded or otherwise ignored by the verification control unit 118. In this manner, the verification control unit 118 need not analyze all portions of the CAD data and/or the numerical control data. Instead, the verification control unit 118 may ignore non-essential data (that is, data unrelated to actual placement of composite material), thereby increasing the speed and efficiency of the verification process.

The inspection control unit 120 is used to compare inspection data as detected by the inspection system 116 with the CAD data. The inspection system 116 may inspect the composite part 110 as it being formed (for example, fabricated). In at least one other embodiment, the inspection system 116 may inspect the composite part 110 after it is formed. In at least one other embodiment, the inspection system 116 may inspect a virtual composite part before the actual composite part 110 is formed (such as before any of the plies 112 are laid up on the forming structure).

The inspection system 116 generates the inspection data (such as ply thickness, ply positions, angular variations, and/or the like) related to one or more plies 112. The inspection control unit 120 compares the inspection data with the CAD data to determine whether the composite part 110 as (or as or before being) formed complies with the CAD data. The inspection control unit 120 may check various structural and geometric properties of the inspection data in relation to the CAD data. For example, the inspection control unit 120 may check ply boundaries, course length, stagger between plies, ply orientation, angular deviation between plies 112, and the like. As noted, the structural and geometric properties may relate to features of the plies 112 as they are laid up over the forming structure 114 and/or another ply 112. Other data that relates to aspects of the forming process that are not related to ply lay-up operations (for example, temperature of a forming environment, curing time, type of forming structure used, and the like) are considered non-essential and may be discarded or otherwise ignored by the inspection control unit 120. In this manner, the inspection control unit 120 need not analyze all portions of the CAD data and/or the inspection data. Instead, the inspection control unit 120 may ignore non-essential data (that is, data unrelated to actual placement of composite material), thereby increasing the speed and efficiency of the inspection process.

The inspection control unit 120 determines whether the inspection data conforms to the CAD data. As noted, the part analysis tool 104 may store one or more conformance thresholds in memory, which may be part of the inspection control unit 120 or otherwise coupled thereto. If the inspection data conforms to the CAD data, the inspection control unit 120 determines that engineering intent has been satisfied, and the composite part 110 continues to be formed, and/or is verified as being an acceptable part. If, however, the inspection data does not conform to the CAD data, the inspection control unit 120 determines that the composite part 110 is to be revised or otherwise reworked.

In at least one embodiment, the inspection control unit 120 may virtually inspect the composite part 110 before it is formed. For example, after the verification control unit 118 verifies that the numerical control data conforms to the CAD data, the inspection control unit 120 may analyze a virtual composite part that is defined by data generated by the CAD system 102 and/or the part analysis tool 104. The inspection control unit 120 may inspect the various features of the virtual composite part before an actual part is formed, thereby reducing the risk of actual composite material being wasted.

The inspection control unit 120 may compare inspection data to the CAD data after the verification control unit 118 compares the numerical control data with the CAD data. In at least one other embodiment, the inspection control unit 120 may operate concurrently with the verification control unit 118. For example, the inspection control unit 120 may analyze the inspection data in relation to the CAD data at the same time as the verification control unit 118 analyzes the numerical control data in relation to the CAD data.

As described above, the part analysis tool 104 may include one or more control units, such as the verification control unit 118 that is used to verify the numerical control data conforms to the CAD data, and the inspection control unit 120 that is used to verify that the inspection data conforms to the CAD data. As used herein, the term "control unit," "unit," "central processing unit," "CPU," "computer," or the like may include any processor-based or microprocessor-based system including systems using microcontrollers, reduced instruction set computers (RISC), application specific integrated circuits (ASICs), logic circuits, and any other circuit or processor including hardware, software, or a combination thereof capable of executing the functions described herein. Such are exemplary only, and are thus not intended to limit in any way the definition and/or meaning of such terms. For example, the control units 118 and 120 may be or include one or more processors that are configured to control operation of the system 100.

The control units 118 and 120 are configured to execute a set of instructions that are stored in one or more storage elements (such as one or more memories), in order to process data. For example, the control units 118 and 120 may include or be coupled to one or more memories. The storage elements may also store data or other information as desired or needed. The storage elements may be in the form of an information source or a physical memory element within a processing machine.

The set of instructions may include various commands that instruct the control units 118 and 120 as a processing machine to perform specific operations such as the methods and processes of the various embodiments of the subject matter described herein. The set of instructions may be in the form of a software program. The software may be in various forms such as system software or application software. Further, the software may be in the form of a collection of separate programs, a program subset within a larger program or a portion of a program. The software may also include modular programming in the form of object-oriented programming. The processing of input data by the processing machine may be in response to user commands, or in response to results of previous processing, or in response to a request made by another processing machine.

The diagrams of embodiments herein may illustrate one or more control or processing units, such as the control units 118 and 120. It is to be understood that the processing or control units may represent circuits, circuitry, or portions thereof that may be implemented as hardware with associated instructions (e.g., software stored on a tangible and non-transitory computer readable storage medium, such as a computer hard drive, ROM, RAM, or the like) that perform the operations described herein. The hardware may include state machine circuitry hardwired to perform the functions described herein. Optionally, the hardware may include electronic circuits that include and/or are connected to one or more logic-based devices, such as microprocessors, processors, controllers, or the like. Optionally, the control units 118 and 120 may represent processing circuitry such as one or more of a field programmable gate array (FPGA), application specific integrated circuit (ASIC), microprocessor(s), and/or the like. The circuits in various embodiments may be configured to execute one or more algorithms to perform functions described herein. The one or more algorithms may include aspects of embodiments disclosed herein, whether or not expressly identified in a flowchart or a method.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

Figure 3:
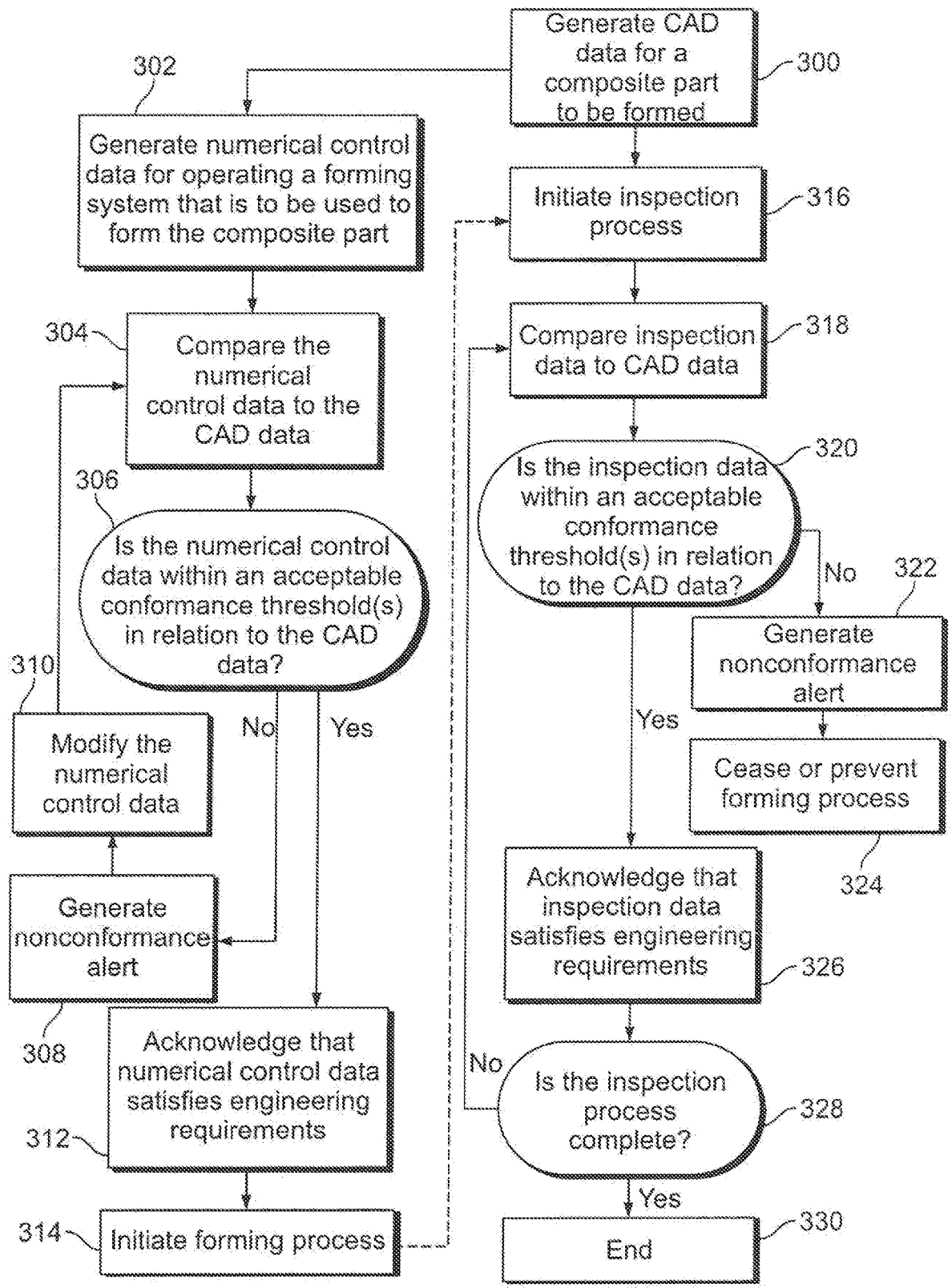
FIG. 3 illustrates a flow chart of a method of forming a composite structure, according to an embodiment of the present disclosure.

FIG. 3 illustrates a flow chart of a method of forming a composite structure, according to an embodiment of the present disclosure. The part analysis tool 104, including the control units 118 and 120 (shown in FIG. 1) may be configured to operate according to the method shown and described with respect to FIG. 3.

The method begins at 300, in which CAD data for a composite part is generated. For example, an individual may design a composite part using the CAD system 102 shown in FIG. 1. The CAD data includes one or more authoritative part definitions and process specifications for the composite part.

At 302, numerical control data for operating a forming system (such as a composite layup system) that is to be used to form (for example, fabricate) the composite part is generated. The numerical control data is used to control the forming system to form the composite part according to the CAD data.

At 304, the numerical control data is compared to the CAD data. For example, the verification control unit 118 shown in FIG. 1 may be used to compare the numerical control data with the CAD data.

At 306, it is determined whether the numerical control data is within one or more conformance threshold(s) in relation to the CAD data. If the numerical control data is not within the conformance threshold(s), the method proceeds from 306 to 308, in which a nonconformance alert is generated. For example, the verification control unit 118 may generate a graphical or audio alert that may be displayed or emitted on a workstation, such as the CAD system 102. The method than proceeds from 308 to 310, in which the numerical control data is modified. For example, the part analysis tool 104 may transmit revisions or suggested revisions to the part programming system 106 (shown in FIG. 1), which may then modify the numerical control data. The method then returns to 304. Optionally, the alert generation at 308 may be omitted, and the method may proceed from 306 to 310.

If the numerical control data is within an acceptable conformance threshold(s) in relation to the CAD data, the method proceeds from 306 to 312, in which it is acknowledged that the numerical control data satisfies engineering requirements as defined in the CAD data. The method then proceeds from 312 to 314, in which a forming process of the composite part is initiated. In at least one embodiment, after the forming process is initiated, the method may proceed from 314 to 316, in which an inspection process of the plies 112 and/or the composite part 110 (shown in FIGS. 1 and 2) is initiated. In at least one other embodiment, the inspection process may be initiated at 316 after the CAD data is generated at 300 before the forming process is started. In at least one embodiment, steps 302 and 316 may be concurrent.

At 318, inspection data generated from the inspection process is compared to the CAD data. For example, the inspection control unit 120 (shown in FIG. 1) may compare the inspection data with the CAD data.

At 320, it is determined whether the inspection data is within an acceptable conformance threshold(s) in relation to the CAD data. If the inspection data is not within the acceptable conformance threshold(s), the method proceeds from 320 to 322, in which a nonconformance alert is generated, and the forming process is ceased or prevented at 324. Optionally, step 322 may be omitted, and the method may proceed from 320 to 324.

If, however, the inspection data is within the acceptable conformance threshold(s), the method proceeds from 320 to 326, in which it is acknowledged that the inspection data satisfies the engineering requirements as defined in the CAD data. For example, the inspection control unit 120 may output an acknowledgement signal to the CAD system 102.

At 328, it is determined whether the inspection process is complete. If the inspection process is not complete, the method returns to 318. If, however, the inspection process is complete, the method ends at 330.

As described above, embodiments of the present disclosure provide systems and methods for efficiently analyzing numerical control data and inspection data to determine whether they conform to engineering requirements as defined by CAD data. Embodiments of the present disclosure provide systems and methods that efficiently process such data, thereby reducing the time and effort of composite part verification and inspection processes.

Embodiments of the present disclosure provide systems and methods that significantly decrease the processing time and energy of a computing device. Embodiments of the present disclosure provide systems and methods that allow large amounts of data to be quickly and efficiently analyzed by a computing device, such as the part analysis tool 104 (shown in FIG. 1). For example, an authoritative part definition and process specifications for a composite part (such as that of an aircraft) may be complex and complicated. The vast amounts of data within the authoritative part definition may be efficiently organized and/or analyzed by the part analysis tool 104 (shown in FIG. 1). In at least one embodiment, the part analysis tool 104 discards, disregards, or otherwise ignores non-essential data that is unrelated to the positioning and placement of plies of composite material during a lay-up process, thereby increasing the efficiency of the verification and inspection. The part analysis tool 104 analyzes the data in a relatively short time. A human being would be incapable of analyzing such vast amounts of data in such a short time. Accordingly, embodiments of the present disclosure provide increased and efficient functionality with respect to prior computing systems, and significantly superior performance in relation to a human being analyzing the vast amounts of data. In short, embodiments of the present disclosure provide systems and methods that analyze thousands, if not millions, of calculations and computations that a human being is incapable of efficiently, effectively and accurately managing. It has been found that embodiments of the present disclosure provide systems and methods that efficiently analyze data, use less memory, and reduce network consumption, as compared to prior systems and methods.

Embodiments of the present disclosure provide systems and methods that may utilize multi-threading to efficiently analyze data. For example, the numerical control data verification process and the inspection may process may be concurrent.

Further, the systems and methods may batch process data. For example, the systems and methods may sequence through data files without interruption, in contrast to previous known systems.

Also, the systems and methods are efficient and operate in a relatively rapid fashion. By ignoring non-essential data, the systems and methods may quickly and efficiently verify the numerical control data in relation to the CAD data, and validate the inspection data with respect to the CAD data. Also, certain embodiments of the present disclosure provide systems and methods that eliminate, minimize, or otherwise reduce false errors, in that a reduced data set that does not include non-essential data is analyzed.

While various spatial and directional terms, such as top, bottom, lower, mid, lateral, horizontal, vertical, front and the like may be used to describe embodiments of the present disclosure, it is understood that such terms are merely used with respect to the orientations shown in the drawings. The orientations may be inverted, rotated, or otherwise changed, such that an upper portion is a lower portion, and vice versa, horizontal becomes vertical, and the like.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the disclosure without departing from their scope. While the dimensions and types of materials described herein are intended to define the parameters of the various embodiments of the disclosure, the embodiments are by no means limiting and are exemplary embodiments. Many other embodiments will be apparent to those of skill in the art upon reviewing the above description. The scope of the various embodiments of the disclosure should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose the various embodiments of the disclosure, including the best mode, and also to enable any person skilled in the art to practice the various embodiments of the disclosure, including making and using any devices or systems and performing any incorporated methods. The patentable scope of the various embodiments of the disclosure is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal language of the claims.

What is claimed is:

1. A part analysis tool for analyzing aspects of a composite part, the part analysis tool comprising:
a verification control unit that compares numerical control data used to control operation of a forming system that is used to form the composite part to computer-aided design (CAD) data that includes an authoritative part definition for the composite part, wherein the verification control unit determines whether the numerical control data is within one or more conformance thresholds related to the CAD data before the forming system uses numerical control data to form the composite part.

2. The part analysis tool of claim 1, wherein the verification control unit disregards non-essential data within the numerical control data.

3. The part analysis tool of claim 2, wherein the non-essential data is unrelated to laying up plies of composite material that form the composite part.

4. The part analysis tool of claim 1, wherein the numerical control data comprises structural and geometric data of the composite part.

5. The part analysis tool of claim 4, wherein the structural and geometric data of the composite part comprises part length, number of plies of composite material, ply boundary areas, stagger between plies, ply orientation, and angular deviation between plies.

6. The part analysis tool of claim 1, further comprising an inspection control unit that compares inspection data of one or more plies of the composite part to the CAD data, wherein the inspection control unit determines whether the inspection data is within the one or more conformance thresholds related to the CAD data.

7. The part analysis tool of claim 6, wherein the inspection control unit compares the inspection data to the CAD data after the verification control unit compares the numerical control data to the CAD data.

8. The part analysis tool of claim 6, wherein the inspection control unit compares the inspection data to the CAD data as the verification control unit compares the numerical control data to the CAD data.

9. The part analysis tool of claim 6, wherein the inspection control unit analyzes the inspection data of a virtual representation of the composite part.

10. A composite part forming system configured to form a composite part, wherein the composite part forming system comprises:

a computer-aided design (CAD) system operable to generate CAD data that includes an authoritative part definition for the composite part;

a forming system operable to form the composite part based on numerical control data;

an inspection system operable to inspect the composite part before, during, or after formation of the composite part and generate inspection data that relates to inspection of the composite part; and a part analysis tool comprising one or more processors including: (a) a verification control unit that compares the numerical control data used to control operation of the forming system to the CAD data before the forming system operates to form the composite part, wherein the verification control unit determines whether the numerical control data is within one or more conformance thresholds related to the CAD data, and (b) an inspection control unit that compares the inspection data to the CAD data, wherein the inspection control unit determines whether the inspection data is within the one or more conformance thresholds related to the CAD data.

11. The composite part forming system of claim 10, wherein the verification control unit disregards non-essential data within the numerical control data, wherein the non-essential data is unrelated to laying up plies of composite material that form the composite part, and wherein the numerical control data comprises structural and geometric data of the composite part.

12. The composite part forming system of claim 11, wherein the structural and geometric data of the composite part comprises part length, number of plies of composite material, ply boundary areas, stagger between plies, ply orientation, and angular deviation between plies.

13. The composite part forming system of claim 11, wherein the inspection control unit compares the inspection data to the CAD data after the verification control unit compares the numerical control data to the CAD data.

14. The composite part forming system of claim 11, wherein the inspection control unit compares the inspection data to the CAD data as the verification control unit compares the numerical control data to the CAD data.

15. The composite part forming system of claim 11, wherein the inspection control unit analyzes the inspection data of a virtual representation of the composite part.

16. A method for analyzing aspects of a composite part, the method comprising:
generating computer-aided design (CAD) data that includes an authoritative part definition for the composite part;
receiving numerical control data used to control operation of a forming system that is used to form the composite part;
comparing the numerical control data to the CAD data before the forming system operates based on numerical control data to form the composite part;
determining, through the comparing the numerical control data to the CAD data, whether the numerical control data is within one or more conformance thresholds related to the CAD data;
receiving inspection data of one or more plies of the composite part;
comparing the inspection data to the CAD data; and
determining, through the comparing the inspection data to the CAD data, whether the inspection data is within the one or more conformance thresholds related to the CAD data.

17. The method of claim 16, wherein the comparing the numerical control data to the CAD data comprises disregarding non-essential data within the numerical control data, wherein the non-essential data is unrelated to laying up plies of composite material that form the composite part, and wherein the numerical control data comprises structural and geometric data of the composite part.

18. The method of claim 17, wherein the structural and geometric data of the composite part comprises part length, number of plies of composite material, ply boundary areas, stagger between plies, ply orientation, and angular deviation between plies.

19. The method of claim 16, wherein the comparing the inspection data to the CAD data is concurrent with the comparing the numerical control data to the CAD data.

20. The method of claim 16, wherein the receiving the inspection data comprises receiving the inspection data of a virtual representation of the composite part.

* * * * *